(12) United States Patent
Shinomiya (10) Patent No.: US 7,633,543 B2
(45) Date of Patent: *Dec. 15, 2009

(54) SOLID STATE IMAGING APPARATUS

(75) Inventor: Kohji Shinomiya, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 366 days.

This patent is subject to a terminal disclaimer.

(21) Appl. No.: 11/670,654

(22) Filed: Feb. 2, 2007

(65) Prior Publication Data

US 2007/0126923 A1 Jun. 7, 2007

Related U.S. Application Data

(63) Continuation of application No. 11/376,249, filed on Mar. 16, 2006, now Pat. No. 7,190,404, which is a continuation of application No. 09/791,584, filed on Feb. 26, 2001, now Pat. No. 7,046,296.

(30) Foreign Application Priority Data

Jun. 16, 2000 (JP) ............................. 2000-181187
Sep. 8, 2000 (JP) ............................. 2000-273029

(51) Int. Cl.
H04N 5/225 (2006.01)
(52) U.S. Cl. ...................................... 348/340; 348/374
(58) Field of Classification Search ................. 348/340, 348/374
See application file for complete search history.

(56) References Cited

U.S. PATENT DOCUMENTS

| 4,634,884 | A | 1/1987 | Hayashimoto et al. |
| 5,021,888 | A | 6/1991 | Kondou et al. |
| 5,424,531 | A | 6/1995 | O'Regan et al. |
| 5,506,401 | A | 4/1996 | Segawa et al. |
| 5,748,448 | A | 5/1998 | Hokari |
| 5,786,589 | A | 7/1998 | Segawa et al. |
| 6,043,482 | A | 3/2000 | Hagl et al. |
| 6,160,967 | A | 12/2000 | Mizobuchi |
| 6,417,885 | B1 | 7/2002 | Suzuki et al. |
| 6,483,101 | B1 | 11/2002 | Webster |
| 6,528,778 | B1 | 3/2003 | Kimba et al. |
| 6,654,064 | B2 | 11/2003 | Ishikawa |
| 6,727,564 | B2 | 4/2004 | Shinomiya |
| 7,190,404 | B2 * | 3/2007 | Shinomiya .................. 348/374 |
| 7,357,757 | B2 | 4/2008 | Brown |
| 2001/0030276 | A1 | 10/2001 | Hoshino |
| 2001/0050717 | A1 | 12/2001 | Yamada et al. |

FOREIGN PATENT DOCUMENTS

| DE | 196 51 260 | 1/1998 |
| DE | 198 00928 | 4/1999 |
| JP | 60-18958 | 1/1985 |

(Continued)

*Primary Examiner*—Sinh Tran
*Assistant Examiner*—Jason Flohre
(74) *Attorney, Agent, or Firm*—Leydig, Voit & Mayer, Ltd.

(57) ABSTRACT

A solid state imaging apparatus includes a solid state imaging element, an optical lens held by a frame, and a flexible printed circuit board having first and second surfaces. The solid state imaging element is mounted on the first surface of the flexible printed circuit board and the frame is mounted on the second surface.

7 Claims, 8 Drawing Sheets

FOREIGN PATENT DOCUMENTS

| | | |
|---|---|---|
| JP | 7-95485 | 4/1995 |
| JP | 7-99214 A | 4/1995 |
| JP | 8-148666 A | 6/1996 |
| JP | 8-306898 A | 11/1996 |
| JP | 9-55487 A | 2/1997 |
| JP | 9-135010 A | 5/1997 |
| JP | 9-146011 A | 6/1997 |
| JP | 10-41492 | 2/1998 |
| JP | 10-51669 A | 2/1998 |
| JP | 11-191864 | 7/1999 |
| JP | 11-354769 A | 12/1999 |
| JP | 2000-66089 A | 3/2000 |
| JP | 2001-78064 A | 3/2001 |
| JP | 2001-128072 A | 5/2001 |
| JP | 2001-203913 A | 7/2001 |

\* cited by examiner

SOLID STATE IMAGING APPARATUS

FIELD OF THE INVENTION

The present invention in general relates to a solid state imaging apparatus having a solid state imaging element and an optical lens. In particular, this invention relates to a solid state imaging apparatus which has a small size and small volume and high performance.

BACKGROUND OF THE INVENTION

Figure 13:
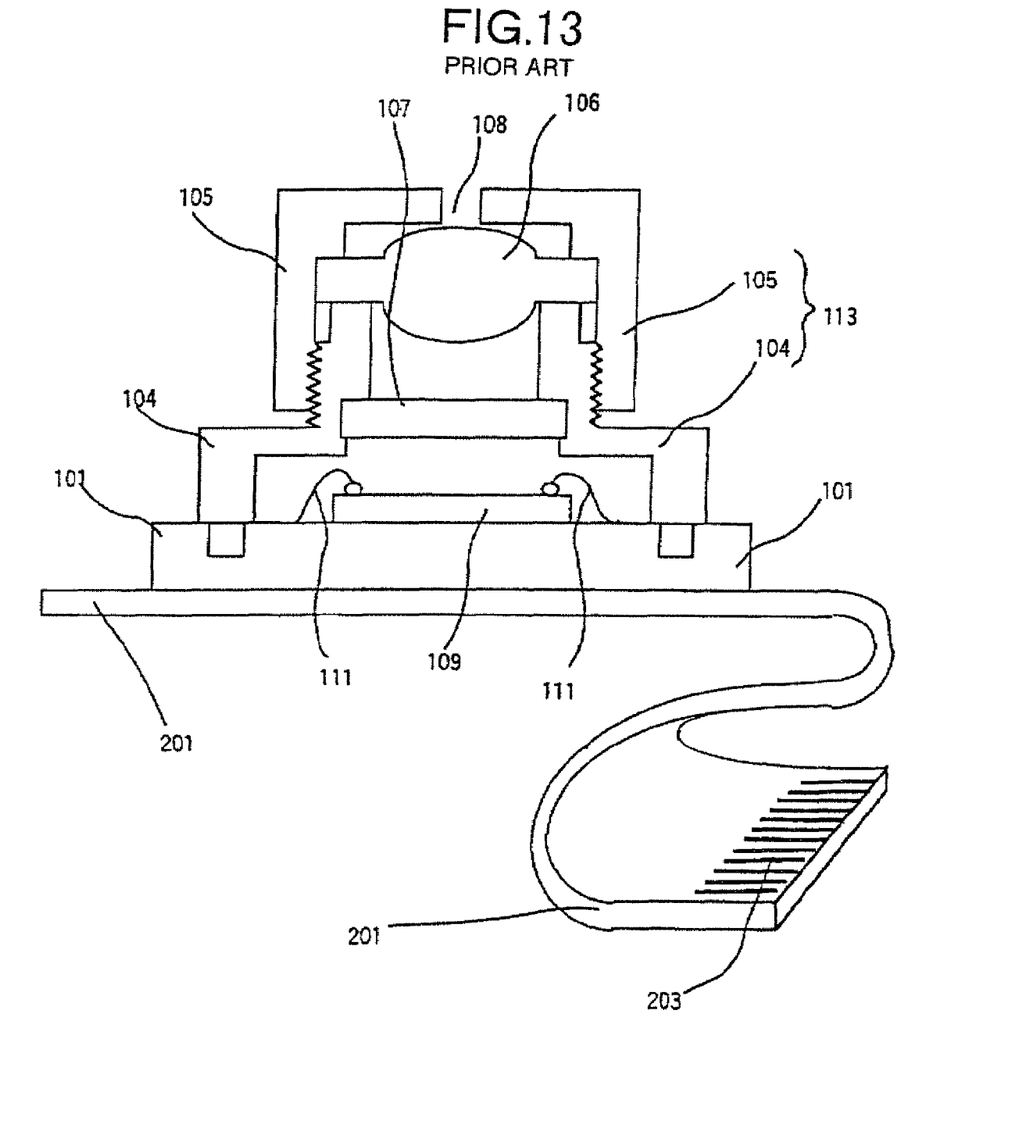
FIG. 13 is a sectional view of a conventional solid state imaging apparatus.

For example, Japanese Patent Application Laid-Open Publication No. 10-41492 discloses a conventional solid state imaging apparatus. A sectional view of this solid state imaging apparatus is shown in FIG. 13. Legend 101 denotes a printed circuit rigid board made of a material such as ceramics or glass epoxy. Legend 104 denotes a pedestal made of a material such as resin for fixing an optical lens and an optical filter. Legend 105 denotes a cap made of a material such as resin for fixing the optical lens. The fixing pedestal 104 and the fixing cap 105 form a frame 113. Legend 106 denotes an optical lens made of a resin such as acryloyl. Legend 107 denotes the optical filter made of a material such as resin or glass. Legend 108 denotes a diaphragm, 109 denotes a solid state imaging element, 111 denotes a wire bond electrode connection portion, 201 denotes a printed circuit flexible board, and 203 denotes an external connection terminal.

Operation of the conventional solid state imaging apparatus will now be explained. Light which passes through the diaphragm 108 passes through the optical lens 106, and then passes through the optical filter 107. This light then falls on an imaging area of the solid state imaging element 109 where an image is formed. Video information of thus formed image is converted into electric signal, electrically coupled to the printed circuit rigid board 101 via the wire bond electrode connection portions 111, and further electrically coupled to the printed circuit flexible board 201 connected to the printed circuit rigid board 101. The electric signal is taken out from the external connection terminal 203 provided on the printed circuit flexible board 201.

Thus, in the conventional solid state imaging apparatus, the wire bond electrode connection portions 111 are required for the electric connection between the solid state imaging element 109 and the printed circuit rigid board 101.

However, because the wire bond electrode connection portions 111 are required, it is necessary to keep a space for the wire portions. As a result reduction of the thickness and size of the apparatus is thus disadvantageously limited.

Considering the thickness reduction of the printed circuit rigid board 101 itself and housing thereof into the case, the attempt to use the printed circuit flexible board 201 has been made. However, for reasons of the position precision securement of the optical lens and the solid state imaging element, stability in the case against vibration or the like, or the poor work efficiency at the time of mounting the solid state imaging element on the board, a rigid board made of glass epoxy or ceramics is used as the board in at least the portion for attaching the solid state imaging element thereto. As shown in FIG. 13, the printed circuit flexible board 201 is joined to the printed circuit rigid board 101 separately by soldering or the like.

However, heat generated by soldering or the like is conveyed to the solid state imaging element 109 via the printed circuit rigid board 101. Thus there is a fear that a color filter mounted on the pixel area of the solid state imaging element 109 will be degraded.

Furthermore, in order to reduce the size of the solid state imaging apparatus, the space of a connection land for connecting the printed circuit rigid board 101 to the printed circuit flexible board 201 becomes necessary. The area of the connection land must be made small as far as possible. In addition, if soldering is performed, it is difficult to perform the connection work with high precision and it takes time to perform the connection work. Even if an automatic connection device is utilized, soldering which does not convey heat to the color filter is needed. Even if, for example, laser heating, light beam heating, pulse tool heating, constant tool heating using robot control, or the like is introduced, therefore, the connection work takes a long time. In addition, a test for determining whether the connection work has been conducted securely becomes necessary. Therefore, a series of these processes takes a long time. This results in a great cost problem.

SUMMARY OF THE INVENTION

It is an object of the present invention to provide a solid state imaging apparatus capable of reducing the volume of the electrical connection portions between the solid state imaging element and the printed circuit board while maintaining the high performance imaging function.

It is an another object of the present invention to provide a solid state imaging apparatus capable of eliminating the connection portions for joining the printed circuit rigid board and the printed circuit flexible board to each other by soldering or the like.

It is an another object of the present invention to provide a solid state imaging apparatus capable of reducing the volume of the housed solid state imaging apparatus in order to reduce the thickness and size at the time when it is housed.

The solid state imaging apparatus according to one aspect of the present invention includes a solid state imaging element, an optical lens held by a frame, and a flexible printed circuit board having two surfaces. The solid state imaging element is mounted on one surface and the optical lens is mounted on the other surface of the flexible printed circuit board.

The solid state imaging apparatus according to another aspect of the present invention includes a solid state imaging element an optical lens held by a frame, a flexible printed circuit board having two surfaces, and a case. The solid state imaging element is mounted on one surface and the optical lens is mounted on the other surface of the flexible printed circuit board. The case houses the flexible printed circuit board after the later is bent.

Other objects and features of this invention will become apparent from the following description with reference to the accompanying drawings.

DESCRIPTION OF THE PREFERRED EMBODIMENTS

Preferred embodiments of the solid state imaging apparatus according the present invention will be explained here with reference to the attached drawings.

Figure 1:
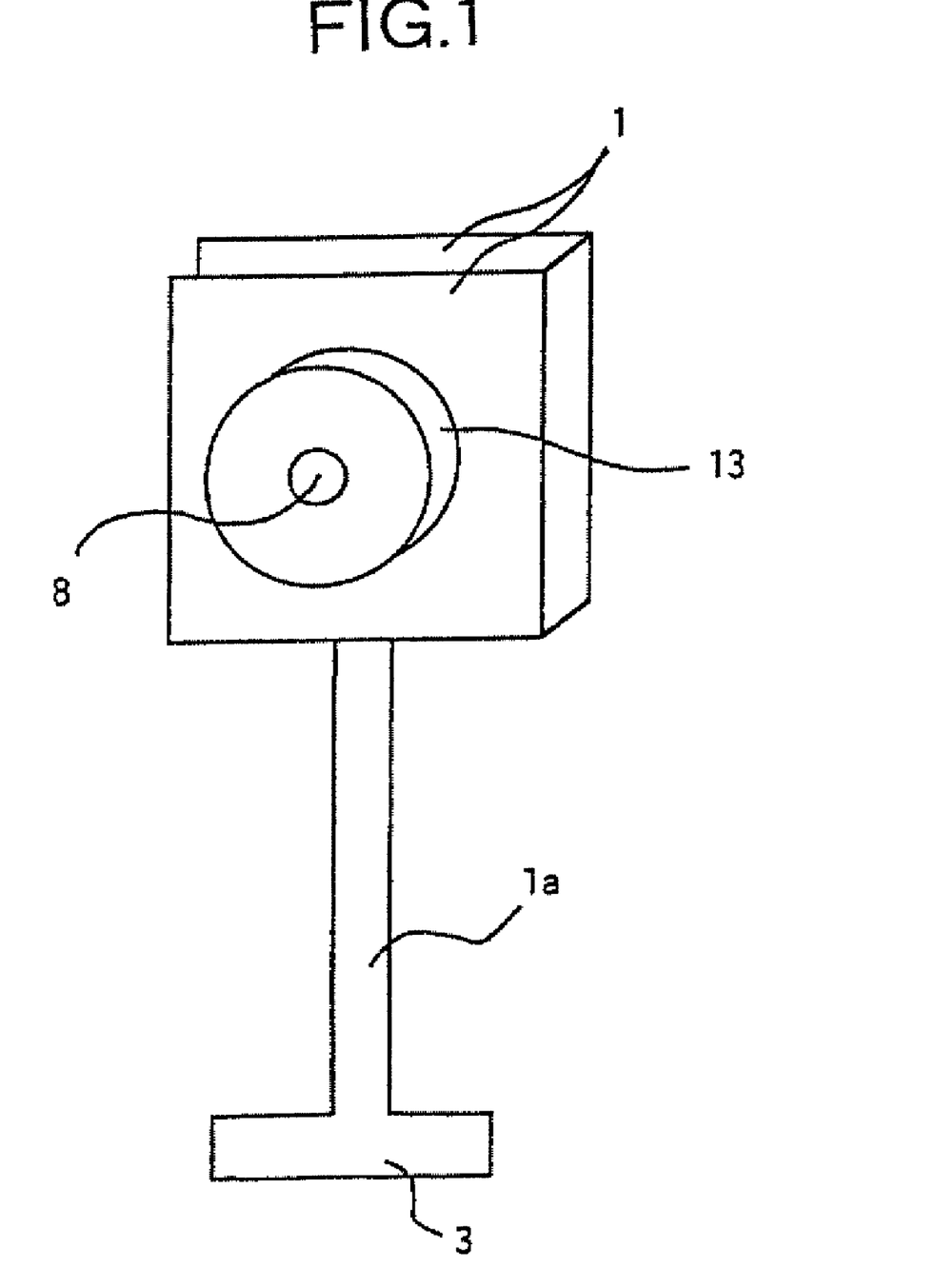
FIG. 1 is an exterior view of a solid state imaging apparatus according to a first embodiment of the present invention.

FIG. 1 is an exterior view of a solid state imaging apparatus according to a first embodiment of the present invention. Legend 1 denotes a flexible printed circuit board (hereafter abbreviated to FPC) made of a film material such as polyimide. The FPC is shown in a state in which the it is bent. Legend 3 denotes an external connection terminal. Legend 13 denotes a frame for holding an optical lens and an optical filter Legend 8 denotes a diaphragm portion for taking in light from the outside.

Figure 2:
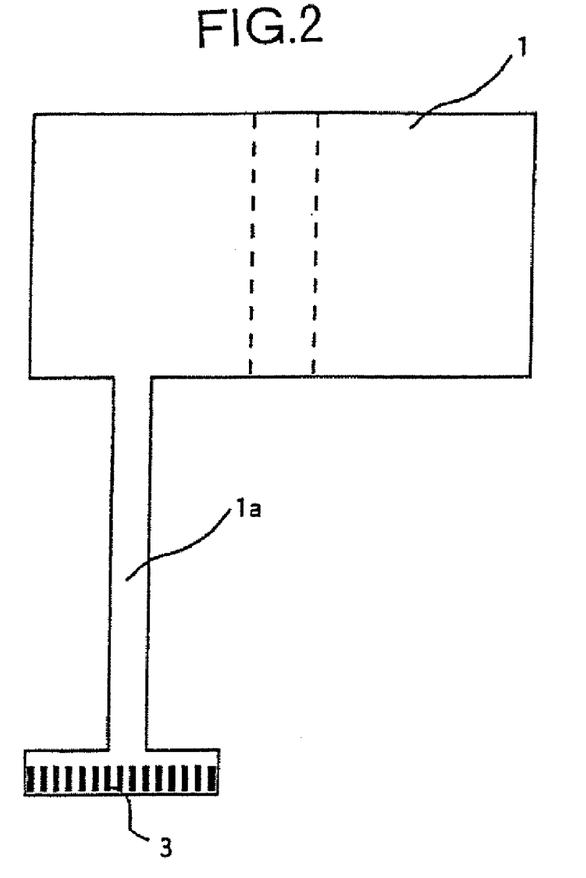
FIG. 2 is a development of a flexible printed circuit board according to the first embodiment of the present invention.

FIG. 2 shows the FPC 1 in a plane state (i.e. not bent). The FPC 1 shown in FIG. 1 can be obtained by bending the right side portion of the FPC 1 shown in FIG. 2 such that it comes to the front side, bending the FPC 1 along broken lines, and mounting the frame 13.

The important feature here is that, a lead wire portion 1a of the FPC 1 including the external connection terminal 3 which conventionally was made of the printed circuit flexible board 201 and a portion formed by the printed circuit rigid board 101 which was conventionally made of ceramics or glass epoxy, are integrated to the FPC 1.

By adopting the structure shown in FIG. 2, the connection process of the printed circuit rigid board 101 and the printed flexible circuit board 201 in the conventional technique can be omitted. This results in drastic improvement of the reliability of the high temperature heat resistance, because the soldering process used for the connection in the conventional technique is eliminated and the solid state imaging element equipped with the color filter having a problem in high temperature heat resistance is not subjected to high temperature of soldering. In addition, the size can also be reduced, because the space for the connection lands of the printed circuit rigid board 101 and the printed circuit flexible board 201 becomes unnecessary.

If the print circuit rigid board 101 of the conventional technique is simply replaced by the FPC 1, however, a great problem occurs in practical use.

If the FPC 1 shown in FIG. 1 is used instead of the printed circuit rigid board 101 shown in FIG. 13, because the hardness of the printed circuit board FPC 1 is low, the position of the solid state imaging element 109 is not stabilized and the planeness cannot be maintained. Thus flip-chip bonding is difficult. Furthermore, slight vibration may cause a discrepancy in the focal distance and an out-of-focus state. Furthermore, there is also a great possibility that the flip-chip bonding connection portions of the solid state imaging element will be subjected to force caused by vibration or the like and the connection condition will become poor.

However, this invention also provides a solution to this problem. How this problem is solved is explained with reference to FIG. 3.

Figure 3:
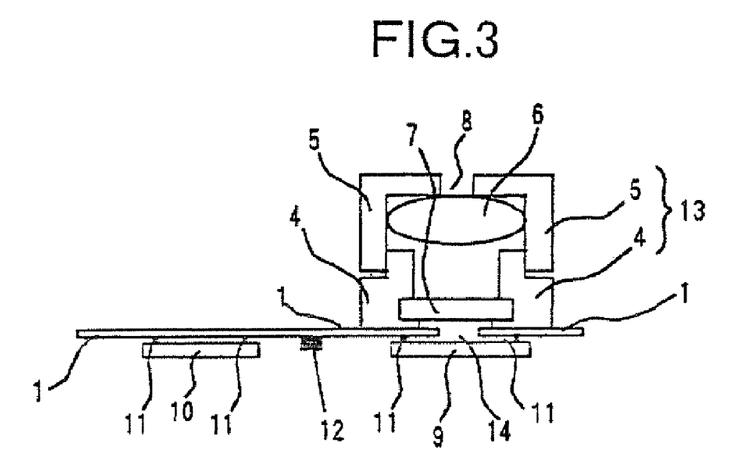
FIG. 3 is a sectional view of a solid state imaging apparatus according to the first embodiment of the present invention.

In FIG. 3, legend 4 denotes a fixing pedestal. The fixing pedestal 4 is adhered to the FPC 1 and fixed while holding an optical filter 7. Legend 5 denotes a fixing cap. The fixing cap 5 is disposed so as to be movable with respect to the fixing pedestal 4 in order to correct the focus, while holding an optical lens 6. The fixing pedestal 4 and the fixing cap 5 form the frame 13 which holds the optical lens 6 and the optical filter 7.

The fixing pedestal 4 and the fixing gap 5 are made movable in order to be adjustable so that light entering through the diaphragm portion 8 may form a focal point on the solid state imaging element 9 via the optical filter 7. It is a matter of course that there is no need to do so when the focal point is fixed. The movement may be implemented by simply a slide mechanism using fitting or by a screw.

A feature in the structure of FIG. 3 is that the FPC 1 is interposed between the frame 13 and the solid state imaging element 9. By adopting such a structure, the optical lens 6 and the solid state imaging element 9 are fixed securely, even if the FPC 1 having low hardness exists between them. Thus it is possible to prevent poor conditions such as the out-of-focus state caused by vibration or the like and the poor connection condition of the solid state imaging element 9. Furthermore, the solid state imaging element 9 is subjected to flip-chip connection via flip-chip joining portions 11 instead of the wire bonding of the conventional technique. As a result, the volume reduction of the connection portions can be implemented. Furthermore, at this time, an opening portion 14 is formed in the FPC 1 in order to receive incident light from the optical lens 6.

In FIG. 3, an IC component 10 such as an image signal processing chip is subject to flip-chip connection in the same way as the solid state imaging element 9. Such a structure that chip components 12 such as resistors and capacitors are mounted is shown as a concrete example.

Figure 4:
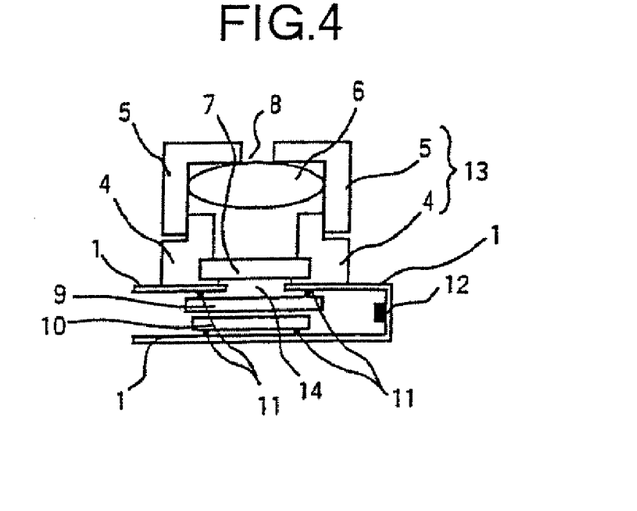
FIG. 4 is a sectional view of a solid state imaging apparatus according to the first embodiment of the present invention.
Figure 5:
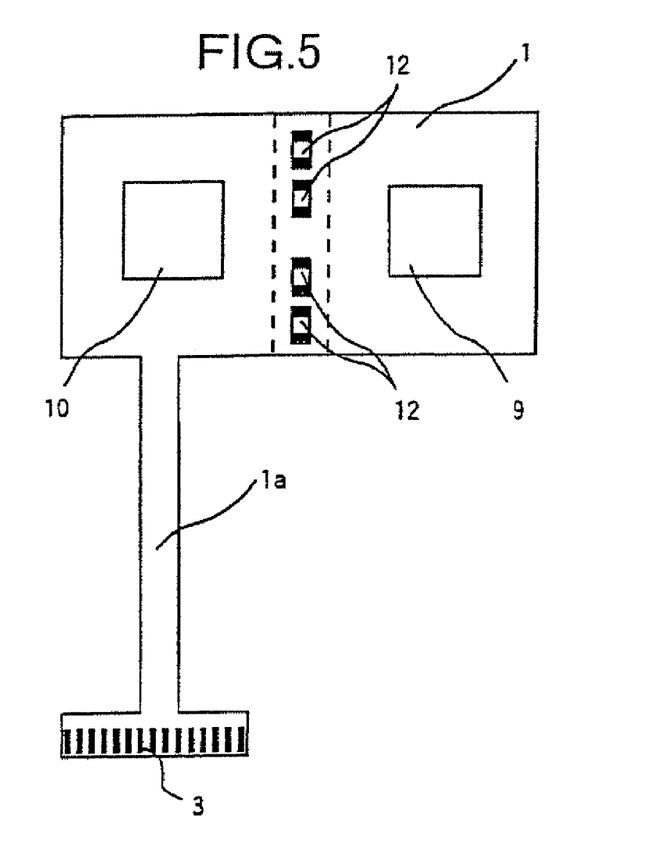
FIG. 5 is a development of a flexible printed circuit board according to the first embodiment of the present invention.

FIG. 4 shows such a state that the FPC 1 in the solid state imaging apparatus of FIG. 3 is bent so as to be able to be housed. FIG. 5 shows the state of the FPC 1 before being bent. When these components are mounted on the FPC 1 concurrently with the solid state imaging element 9, they can be housed in a case (not illustrated) compactly as shown in FIG. 4. Especially the chip components 12 are disposed in the bent portion of the FPC 1 as shown in FIG. 4 and FIG. 5 in order to maximize the space saving effect.

If the solid state imaging apparatus needs to be fixed to the case when it is housed in the case in FIG. 4, it is desirable to fix the solid state imaging apparatus to the case at the fixing pedestal 4. Regarding such fixing, the fixing pedestal 4 may be fixed to the case by screws, or the solid state imaging apparatus may be fitted into the case by using the fixing pedestal 4 as a guide.

When conducting positioning of the fixing pedestal 4, holes for positioning are formed in the FPC 1 beforehand and corresponding projections are formed on the fixing pedestal 4 beforehand, By fitting the projections into the holes, the fixing pedestal 4 can be easily positioned.

In addition, by adhering the solid state imaging device 9 and the IC component to each other, they can be housed in the case more stably.

Operation of the solid state imaging apparatus according to the first embodiment will now be described. Light passing through the diaphragm 8 passes through the optical lens 6 (see FIG. 4), and then passes through the optical filter 7. This light then falls on the imaging area of the solid state imaging element 9 where an image is formed. Video information of thus formed image is converted an electric signal by the solid state imaging element 9, electrically coupled to the FPC 1 via the flip-chip electrode connection portions 11, and further electrically coupled to the signal processing chip 10 and the connection terminal 3 formed integral with the FPC 1, via the printed circuit of the FPC 1.

Because of such electrical connection, it is possible to supply power and control signals from the connection terminal 3 integral with the FPC 1 to the solid state imaging element 9 and the signal processing chip 10, and take out an output signal subjected to signal processing.

Figure 6:
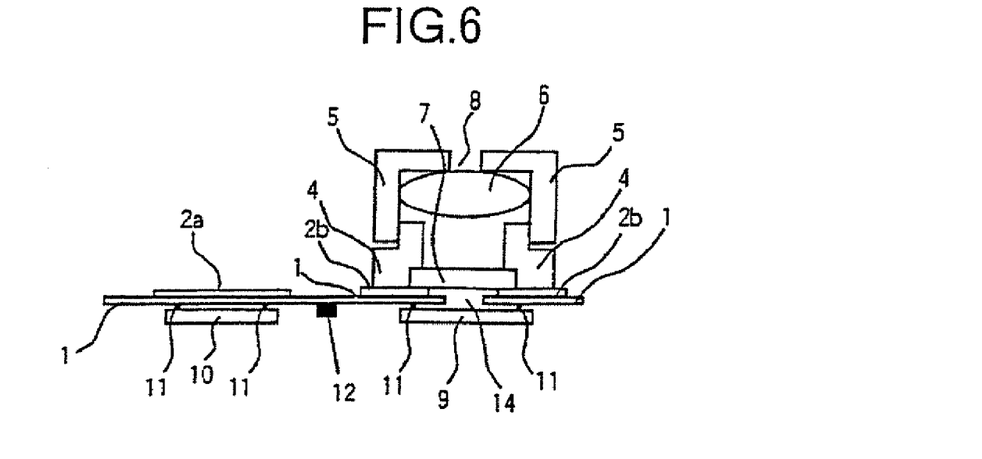
FIG. 6 is a sectional view of a solid state imaging apparatus according to a second embodiment of the present invention.
Figure 7:
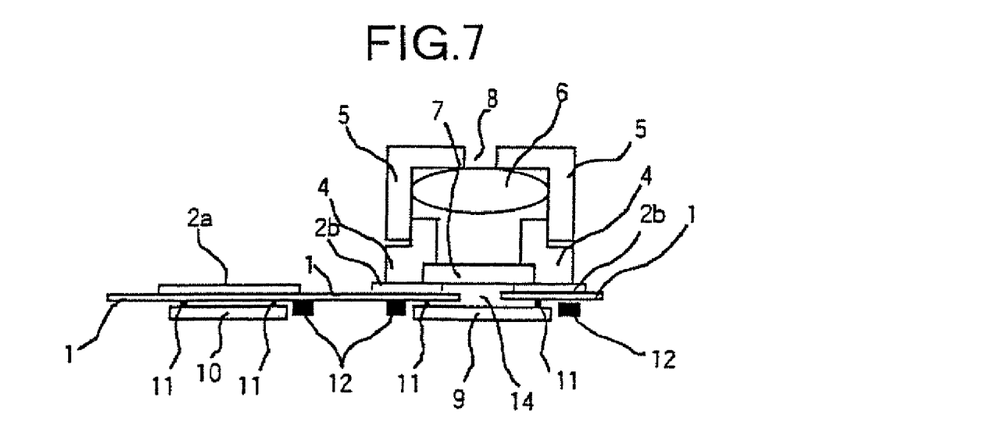
FIG. 7 is a sectional view of a solid state imaging apparatus according to the second embodiment of the present invention.

A second embodiment of the present invention will be explained with reference to FIG. 6 to FIG. 11. In FIG. 6 and FIG. 7, reinforcing plates 2a and 2b are disposed on the opposite side of the FPC 1 corresponding to the place where the solid state imaging element 9 and the IC component 10 shown in FIG. 3 are provided.

A feature in the structure of FIG. 6 and FIG. 7 is to adhere and fix the reinforcing plate 2b to the FPC I to ensure the planeness and hardness of the FPC 1, open a hole for transmitting light through the FPC 1 and the reinforcing plate 2b, form a light transmitting window, i.e., the opening portion 14, and conduct flip-chip connection so as to be capable of forming an image on the imaging area of the solid state imaging element 9. By adopting such a structure, the hardness and planeness of the FPC 1 are ensured and a secure fixing state is achieved, even if the FPC 1 having low hardness exists. Thus it is possible to prevent poor conditions such as the out-of-focus state caused by vibration or the like and the poor connection condition of the solid state imaging element 9. Furthermore, the solid state imaging element 9 is subjected to flip-chip connection via the flip-chip joining portions 11 instead of the wire bonding of the conventional technique. As a result, the volume reduction of the connection portions can be achieved.

Although not illustrated, positioning holes are formed in the reinforcing plate 2b, and projections are formed on the fixing pedestal 4 so as to be fitted in the positioning holes in order to join the reinforcing plate 2b to the fixing pedestal 4. As a result, the attaching work is facilitated, and the reinforcing plate 2b can be adhered and fixed to the fixing pedestal 4 with high precision.

FIG. 6 and FIG. 7 show that the IC component 10 such as the image signal processing chip is subjected to flip-chip connection in the same way as the solid state imaging element 9. Such a structure that chip components 12 such as resistors and capacitors are mounted is shown as a concrete example.

Figure 8:
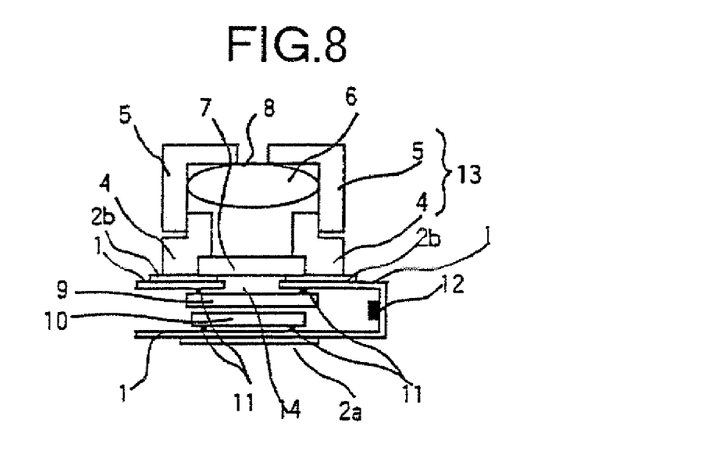
FIG. 8 is a sectional view of a solid state imaging apparatus according to the second embodiment of the present invention.
Figure 9:
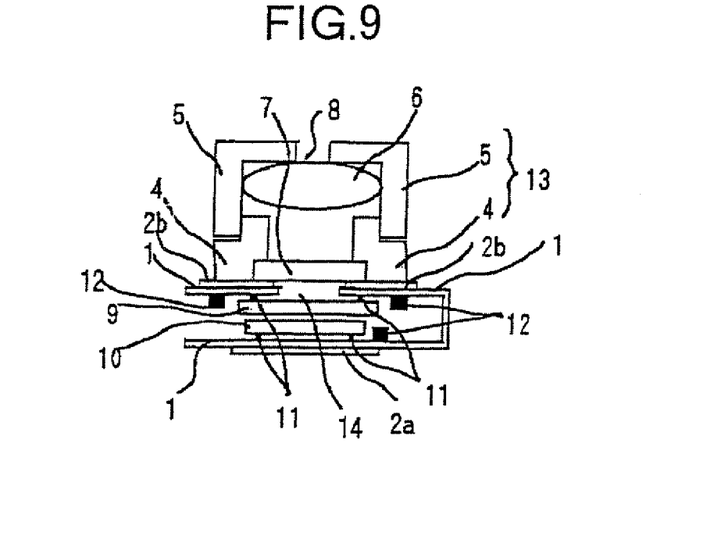
FIG. 9 is a sectional view of a solid state imaging apparatus according to the second embodiment of the present invention.
Figure 10:
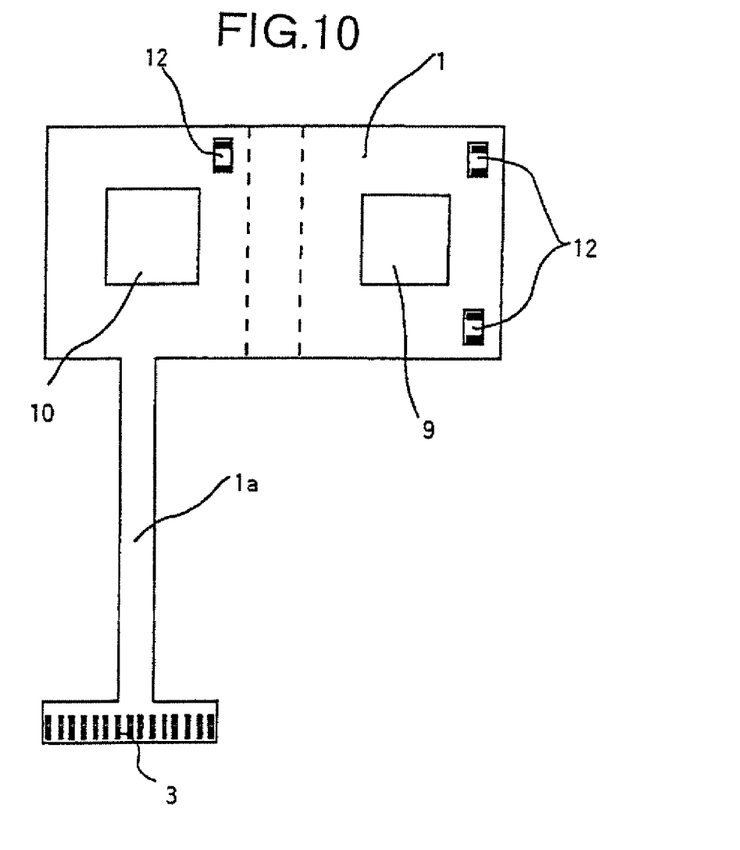
FIG. 10 is a development of a flexible printed circuit board according to the second embodiment of the present invention.
Figure 11:
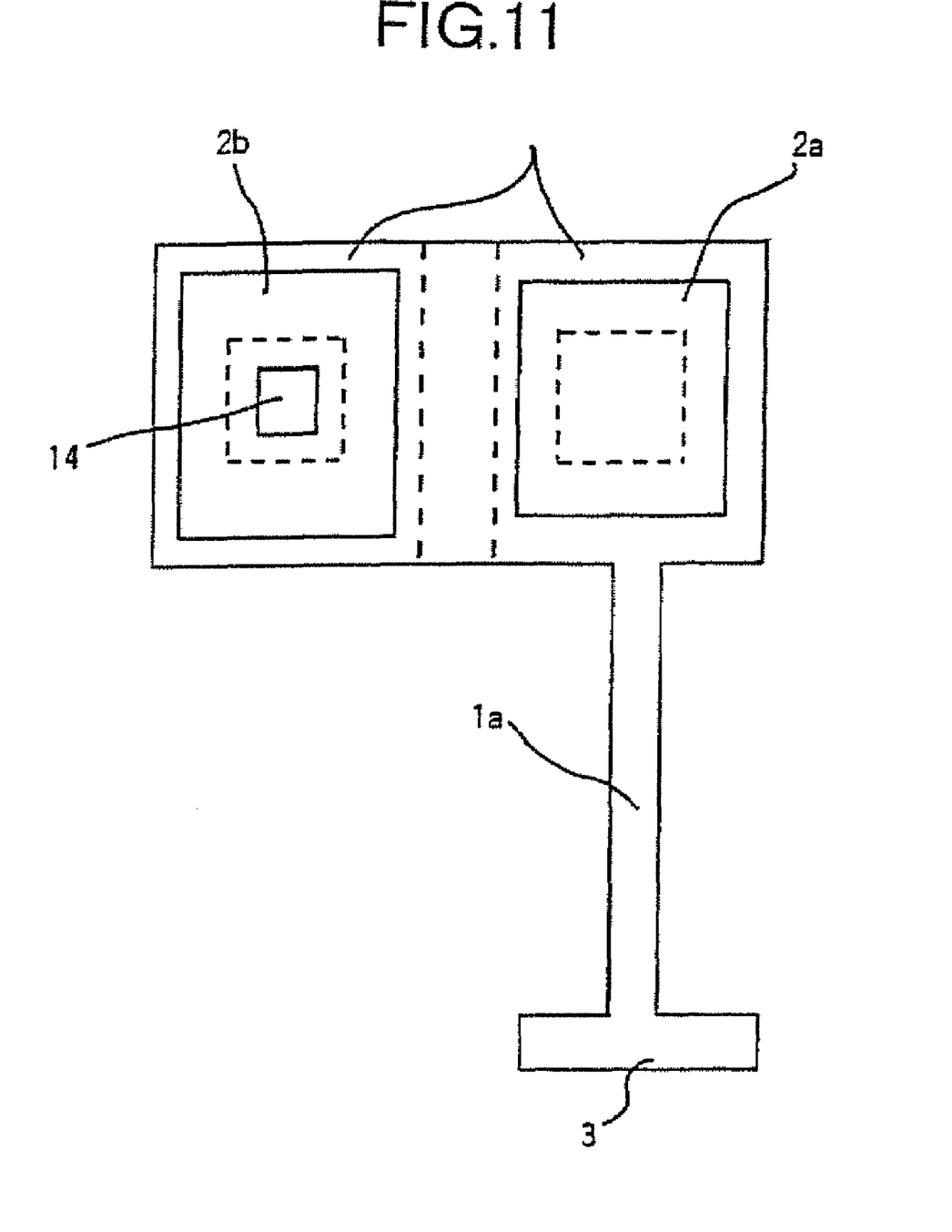
FIG. 11 is a development of a flexible printed circuit board according to the second embodiment of the present invention.

FIG. 8 and FIG. 9 show such a state that the FPC 1 in the solid state imaging apparatus of FIG. 6 and FIG. 7 is bent so as to be able to be housed. FIG. 10 and FIG. 11 show states of the obverse and reverse of the FPC 1 before being bent. When these components are mounted on the FPC 1 concurrently with the solid state imaging element 9, they can be housed in a case (not illustrated) compactly as shown in FIG. 8 and FIG. 9. By disposing especially the chip components 12 in the vacant spaces of the FPC 1 as shown in FIG. 6 to FIG. 10, the space saving effect is obtained and the size can be reduced.

When the IC component is mounted on the flexible circuit board and the flexible circuit board is to be bent, the bending position may be guided by holes formed on a fold of the bent portion at fixed intervals in order to facilitate the bending work.

If the solid state imaging apparatus needs to be fixed to the case when it is housed in the case in FIG. 8 and FIG. 9, it is desirable to fix the solid state imaging apparatus to the case at the fixing pedestal 4. Regarding such fixing, the fixing pedestal 4 may be fixed to the case by screws, or the solid state imaging apparatus may be fitted into the case by using the fixing pedestal 4 as a guide. In addition, by adhering the solid state imaging device 9 and the IC component 10 to each other, they can be housed in the case more stably.

Operation of the solid state imaging apparatus according to the second embodiment will now be described. Light passing through the diaphragm 8 passes through the optical lens 6 (see FIG. 9), and then passes through the optical filter 7. This light falls on the imaging area of the solid state imaging element 9 where an image is formed. Video information of thus formed an image is converted into an electric signal by the solid state imaging element 9, electrically coupled to the FPC 1 via the flip-chip electrode connection portions 11, and further electrically coupled to the signal processing chip 10 and the connection terminal 3 formed integral with the FPC 1 shown in FIG. 10, via the printed circuit of the FPC 1.

Because of such electrical connection, it is possible to supply power and control signals from the connection terminal 3 integral with the FPC 1 to the solid state imaging element 9 and the signal processing chip 10, and take out an output signal subjected to signal processing.

The surface of each of the FPC 1, the reinforcing plates 2a and 2b, the fixing pedestal 4 and the fixing cap 5 may be made black or white. By thus causing absorption or diffused reflection of light and thereby preventing runarounding of light and unnecessary light reflection, an image with high precision can also be obtained.

In the solid state imaging apparatus according to the third embodiment, EMS (Electromagnetic Susceptibility) is enhanced. Electromagnetic shielding can be accomplished by using a double-sided printed circuit board as the FPC 1, forming a pattern such as connection wiring and power wiring on that surface of the printed circuit board on which the solid state imaging element 9 is mounted, the IC component 10, and the chip components 12, and leaving the metallization layer as it is or forming a mesh pattern or the like on the other surface (the surface on which the optical lens is mounted).

The solid state imaging apparatus thus formed is immune to external electromagnetic noise, and it can suppress emission of electromagnetic noise to the outside.

In an alternative structure, the fixing pedestal 4 can be made of a conductive material and it is electrically grounded. By doing so, the resistance to the EMS can be enhanced.

A fourth embodiment of the present invention will be explained. In FIG. 11, reinforcing plates 2a and 2b are disposed across the FPC 1 from the solid state imaging element 9 and the IC component 10 shown in FIG. 10.

The reinforcing plates 2a and 2b serves as a backplate for providing the FPC 1 with the planeness and hardness at the time of flip-chip connection of the solid state imaging element 9 and the IC component 10 to the FPC 1, and serves as a backplate for maintaining the planeness and hardness of the FPC 1 after the flip-chip connection.

By the way, in the opening portion 14 in the structure shown in FIG. 6 to FIG. 9, the reinforcing plate 2b is opened in the same way. By using a light transmitting material as the reinforcing plate 2b, however, it becomes unnecessary to form the opening portion 14 through the reinforcing plate 2b. Thus it is possible to provide the FPC 1 with more stable planeness and hardness. In other words, since there is no opening portion 14 through the reinforcing plate 2b, the planeness and hardness of the FPC 1 can be further enhanced as compared with the case where there is the opening portion 14.

Figure 12:
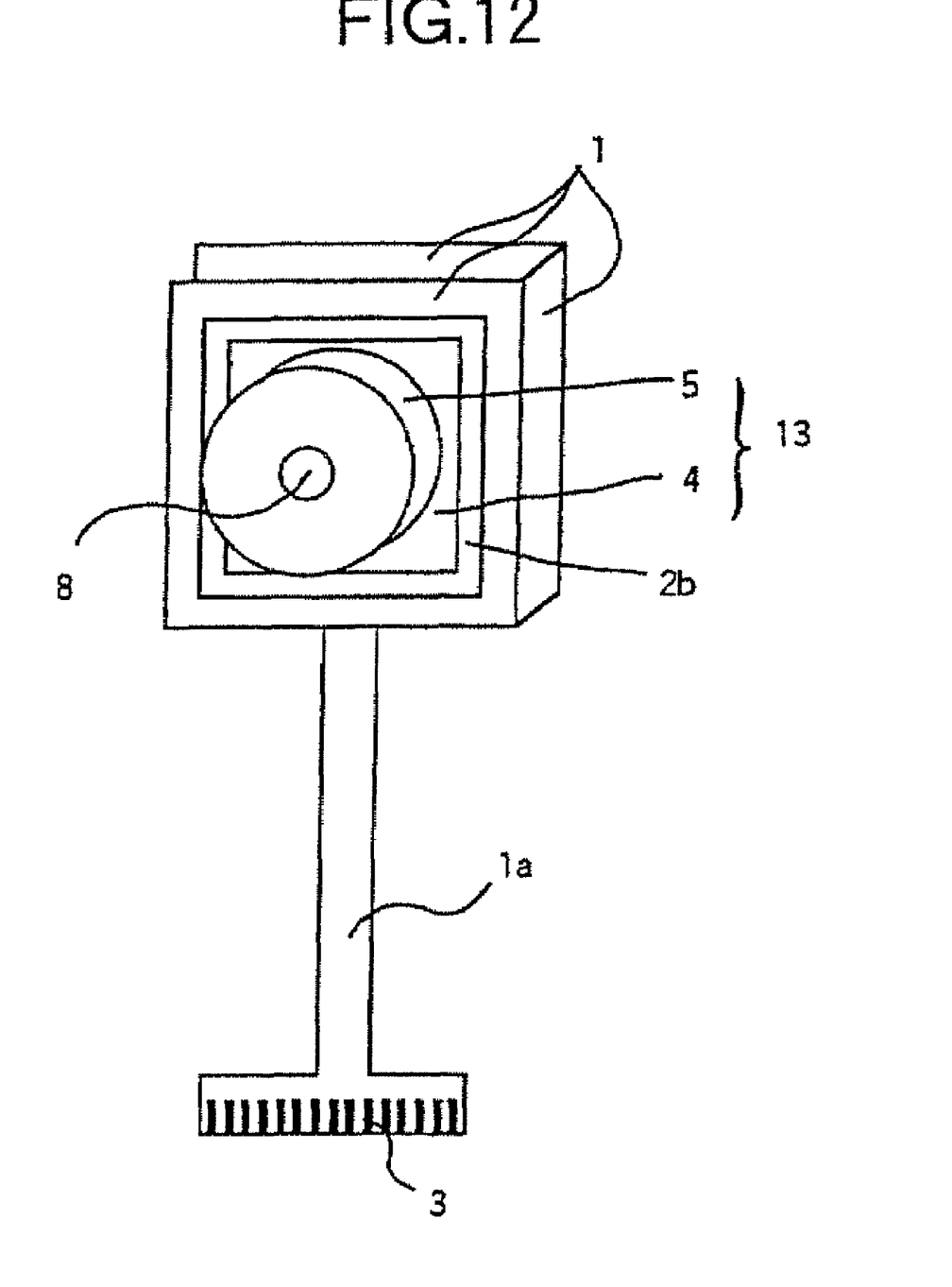
FIG. 12 is an exterior view of a solid state imaging apparatus according to a fifth embodiment of the present invention.

FIG. 12 shows an exterior view of a solid state imaging apparatus according to a fifth embodiment. Legend 1 denotes the FPC made of a film material such as polyimide in the same way as FIG. 1. This FPC 1 is typically fabricated so as to have a thickness of approximately 70 μm. A lead wire portion 1a can be bent to the front side and the back side at angles of ±180 degrees in FIG. 12. Accordingly, imaging can be effected while freely changing the direction of the solid state imaging apparatus and moving it in the direction of the subject.

The lead wire portion 1a is shown to be straight. However, depending on how the solid state imaging apparatus is attached, the shape of the lead wire portion 1a may be changed as desired. As a result, a casing having a reduced size and free design can be obtained.

Furthermore, connection to another device can be effected more easily by using a connector via the external connection terminal 3 provided on the FPC 1 as shown in FIG. 12.

In addition, if the reinforcing plate 2b is made of metal such as aluminum or 42 alloy and coefficient of thermal expansion thereof is matched with that of the solid state imaging element, camber caused by a temperature change of the flexible printed circuit board can be reduced. The flexible printed circuit board may thus be provided with higher planeness and hardness.

As heretofore described, in a solid state imaging apparatus according to the present invention, the solid state imaging element is mounted on one surface of the flexible printed circuit board, and the optical lens is mounted on the other surface. As a result, the volume can be reduced.

Furthermore, in a solid state imaging apparatus according to the present invention, the solid state imaging element is flip-chip connected to the flexible printed circuit board. As a result, the volume can be reduced.

Furthermore, in a solid state imaging apparatus according to the present invention, a reinforcing plate is adhered to the other surface (the surface of which the optical lens is mounted) of the flexible printed circuit board, and a hole is formed through the reinforcing plate and the flexible printed circuit board to form an opening so as to apply light to an imaging area of the solid state imaging element and form an image. In a manufacturing process for mounting the solid state imaging element by using the flip-chip connection, therefore, the flexible printed circuit board can be provided with planeness and hardness.

Therefore, all bumps of the solid state imaging element and all connection lands provided on the flexible printed circuit board can be brought into contact with each other accurately.

In such a state, all bumps of the solid state imaging element and all connection lands provided on the flexible printed circuit board can be connected securely by using conductive resin such as silver paste with a high yield.

Furthermore, in a solid state imaging apparatus according to the present invention, the reinforcing plate is made of a conductive material. Therefore, the resistance against the EMS can be enhanced.

Furthermore, in a solid state imaging apparatus according to the present invention, the volume can be reduced by the flip-chip connection, also in the case where the IC component is mounted of the flexible printed circuit board.

Furthermore, in a solid state imaging apparatus according to the present invention, an optical lens and an optical filter can be included.

Furthermore, in a solid state imaging apparatus according to the present invention, the volume can be reduced by forming an opening portion in the flexible printed circuit board.

Furthermore, in a solid state imaging apparatus according to the present invention, the volume can be reduced when it is housed by bending the flexible printed circuit board.

Furthermore, in a solid state imaging apparatus according to the present invention, focusing can be adjusted by changing the relative position of a fixing cap and a fixing pedestal.

Furthermore, in a solid state imaging apparatus according to the present invention, the fixing pedestal is fixed to a case. Therefore, stable housing can be accomplished.

Furthermore, in a solid state imaging apparatus according to the present invention, the volume at the time of housing can be reduced by mounting chip components on a bent portion of the flexible printed circuit board.

Furthermore, in a solid state imaging apparatus according to the present invention, the resistance against the EMS can be enhanced by using a fixing pedestal made of a conductive material.

Furthermore, in a solid state imaging apparatus according to the present invention, a reinforcing plate is adhered to the other surface (the surface of which the optical lens is mounted) of the flexible printed circuit board, and there is adopted such a structure as to apply light to an imaging area of the solid state imaging element and form an image. Therefore, the reinforcing plate can be adhered to the flexible printed circuit board without forming an opening portion in the flexible printed circuit board. As compared with the case where an opening portion is formed in the flexible printed circuit board, the flexible printed circuit board can be provided with higher planeness and hardness.

As compared with the case where an opening portion is formed in the flexible printed circuit board, therefore, all bumps of the solid state imaging element and all connection lands provided on the flexible printed circuit board can be brought into contact with each other accurately.

In such a state, all bumps of the solid state imaging element and all connection lands provided on the flexible printed circuit board can be connected securely by using conductive resin such as silver paste with a high yield.

Furthermore, in a solid state imaging apparatus according to the present invention, the hardness and planeness of the flexible printed circuit board are ensured even if a flexible printed circuit having low hardness exists in such a stage that construction is completed when an opening is formed in the reinforcing plate or a light transmitting material is used for the reinforcing plate. A securely fixed state is thus accomplished. Thus it is possible to prevent poor conditions such as the out-of-focus state caused by vibration or the like and the poor connection condition of the solid state imaging element.

Furthermore, in a solid state imaging apparatus according to the present invention, guide holes are formed through the reinforcing plate beforehand and the guide holes are used when adhering the reinforcing plate to the frame having an optical lens mounted thereon at the time of manufacturing. Therefore, positioning work is facilitated.

Furthermore, in a solid state imaging apparatus according to the present invention, the flexible printed circuit board is made integral with pull out wires of electric wires, and electrodes for external connection are provided on extensions of the pull out wires of the electric wires. Therefore, the flexible printed circuit board can be bent by ±180 degrees at maximum to the front side or back side with respect to the plane portion of the lead wire portion. The direction of the solid state imaging apparatus can be freely changed and moved according to the direction of the subject. Thus, imaging in the best direction can be accomplished.

Furthermore, the flexible printed circuit board can be bent by ±180 degrees at maximum to the front side or back side with respect to the plane portion of the lead wire portion. When freely changing the direction of the solid state imaging apparatus and moving the direction of the solid state imaging apparatus according to the direction of the subject, the flip-chip connection portion of the solid state imaging element can be kept fixed. Therefore, the connection state can be kept in a favorable state, and the reliability can be improved.

Furthermore, since the solid state imaging apparatus according to the present invention includes the flexible printed circuit board, it can be designed to have a free shape according to the mounting form of the solid state imaging apparatus. And the solid state imaging apparatus can be mounted on a small sized and freely designed case with high space efficiency.

Furthermore, in a solid state imaging apparatus according to the present invention, connection to a device can be effected easily by a connector via an external connection terminal provided on the flexible printed circuit board. Work for incorporating the solid state imaging apparatus into the device can be effected efficiently. Furthermore, at the time of maintenance work of the device having the solid state imaging apparatus mounted thereon, mounting and dismounting can be conducted easily, resulting in efficient maintenance work. Furthermore, at that time, the flip-chip connection portion of the solid state imaging element can be kept fixed by the reinforcing plate. Therefore, the connection state can be kept in a favorable state and the reliability can be ensured.

Furthermore, in a solid state imaging apparatus according to the present invention, the flip-chip connection portion of the solid state imaging element can be kept fixed by the reinforcing plate, when an IC component is mounted on the flexible printed circuit board and the flexible printed circuit board is bent. Therefore, the connection state can be kept in a favorable state and the reliability can be ensured.

Furthermore, in a solid state imaging apparatus according to the present invention, bending work to be effected when an IC component is mounted on the flexible printed circuit board and the flexible printed circuit board is bent can be facilitated by guiding the bending portion by means of holes formed on a fold of the bent portion at fixed intervals.

Furthermore, in a solid state imaging apparatus according to the present invention, the reinforcing plate is made of a metal material such as aluminum or 42 alloy, and its coefficient of thermal expansion is matched to that of the solid state imaging element. As a result, the camber of the flexible printed circuit board can be reduced. And the flexible printed circuit board can be provided with higher planeness and hardness.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A solid state imaging apparatus comprising:
    a solid state imaging element having first and second surfaces, an imaging area on the first surface, and flip-chip joining portions on the first surface;
    an image signal processing chip having first and second surfaces and flip-chip joining portions on the first surface of the image signal processing chip;
    an optical lens held by a frame; and
    a flexible circuit board having first and second surfaces, an opening, and wiring on the first surface of the flexible circuit board, wherein
        the solid state imaging element and the image signal processing chip are flip-chip mounted on the first surface of the flexible circuit board and located to receive light passing through the opening and incident on the imaging area of the solid state imaging element,
        the frame is mounted on the second surface of the flexible circuit board,
        the flexible circuit board is bent so that the second surface of the image signal processing chip faces the second surface of the solid state imaging element,
        the flexible circuit board includes a lead wire portion having an external connection terminal, and
        the flip-chip joining portions of the solid state imaging element are electrically connected to the flip-chip joining portions of the image signal processing chip via the wiring of the flexible circuit board.

2. The solid state imaging apparatus according to claim 1, wherein the external connection terminal is located on the first surface of the flexible circuit board.

3. The solid state imaging apparatus according to claim 1, wherein the image signal processing chip is adhered to the solid state imaging element.

4. The solid state imaging apparatus according to claim 1, wherein the frame comprises a fixing pedestal on the second surface of the flexible circuit board and a fixing cap.

5. The solid state imaging apparatus according to claim 4, wherein location of the fixing cap with respect to the fixing pedestal is changed to effect focus adjustment.

6. The solid state imaging apparatus according to claim 1, including a chip component mounted on the flexible circuit board.

7. The solid state imaging apparatus according to claim 1, including an optical filter held in the frame.

* * * * *